(12) United States Patent
Yuan et al.

(10) Patent No.: US 6,289,412 B1
(45) Date of Patent: Sep. 11, 2001

(54) LAYOUT SYNOPSIZING PROCESS FOR EFFICIENT LAYOUT PARASITIC EXTRACTION AND CIRCUIT SIMULATION IN POST-LAYOUT VERIFICATION

(75) Inventors: Chen-Ping Yuan, Campbell; Che-Cheng Lin, San Jose; You-Pang Wei, Los Altos, all of CA (US)

(73) Assignee: Legend Design Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/267,333

(22) Filed: Mar. 12, 1999

Related U.S. Application Data

(60) Provisional application No. 60/077,902, filed on Mar. 13, 1998.

(51) Int. Cl.[7] ...................................................... G06F 17/50
(52) U.S. Cl. ...................... 711/11; 716/1; 716/2; 716/17; 716/4
(58) Field of Search ............................... 716/1, 2, 11, 17, 716/4, 5, 7; 364/488, 489, 490

(56) References Cited

U.S. PATENT DOCUMENTS

| | | | |
|---|---|---|---|
| 5,694,481 | * 12/1997 | Lam et al. | 382/145 |
| 5,905,669 | * 5/1999 | Honta | 365/51 |
| 5,999,726 | * 12/1999 | Ho | 395/500.6 |
| 6,077,308 | * 6/2000 | Carter et al. | 216/8 |
| 6,099,581 | * 8/2000 | Sakai | 716/11 |
| 6,128,768 | * 10/2000 | Ho | 716/5 |
| 6,144,760 | * 11/2000 | Ohnuma | 382/144 |
| 6,185,722 | * 2/2001 | Darden et al. | 716/5 |

FOREIGN PATENT DOCUMENTS

2000057175 A * 2/2000 (JP).

* cited by examiner

*Primary Examiner*—Viet Q. Nguyen
(74) *Attorney, Agent, or Firm*—Oppenheimer Wolff & Donnelly LLP; Claude A. S. Hamrick; Justin Boyce (57) ABSTRACT

A process is provided for generating a synoptic layout database for efficient layout parasitic extraction and circuit simulation in post-layout verification of an integrated circuit (IC) design for a system having a plurality of repetitive subcircuits. The process includes the steps of: receiving an input layout database including a plurality of geometric objects including cells representing the IC design, each of the cells including a plurality of polygons; identifying a plurality of repetitive cells of the input layout database, the repetitive cells being associated with the repetitive subcircuits; recognizing at least one pattern of the repetitive cells; defining at least one cut region of the input layout database, the cut region being defined by physical layout coordinates, the cut region intersecting a corresponding pattern of the repetitive cells; and generating a synoptic layout database.

17 Claims, 11 Drawing Sheets

LAYOUT SYNOPSIZING PROCESS FOR EFFICIENT LAYOUT PARASITIC EXTRACTION AND CIRCUIT SIMULATION IN POST-LAYOUT VERIFICATION

CROSS REFERENCE TO RELATED APPLICATIONS

This application claims priority to U.S. patent application Ser. No. 60/077,902, filed Mar. 13, 1998, entitled "Method of Automatic Layout Reduction for Simulating ULSI/VLSI Circuit" which is incorporated herein by reference. Also, this application is related to U.S. patent application Ser. No. 08/766,358, filed Dec. 13, 1996, entitled "Method for Simulating ULSI/VLSI Circuit Designs" which is incorporated herein by reference.

BACKGROUND OF THE INVENTION

1. Field of the Invention

The present invention relates generally to computer aided methods and tools for designing, simulating, and verifying integrated circuit (IC) designs. More specifically, the present invention relates to a process of generating a synoptic layout database allowing for efficient layout parasitic extraction and circuit simulation in post-layout verification of an IC design.

2. Description of the Prior Art

The design of an ultra large scale integrated (ULSI) circuit, or a very large scale integrated (VLSI) circuit is a very time-consuming process, even with the use of computer aided design (CAD) systems. VLSI CAD systems support descriptions of hardware at various levels of abstraction, such as system, sub-system, register, gate, circuit, and layout levels. Such systems allow designers to design a hardware device at an abstract level and progressively work down to the layout level.

Most VLSI CAD systems support a layout editor (e.g., the Virtuoso IC Layout and Verification System available from Cadence Design Systems, Inc. of San Jose, Calif.) for generating a layout database which provides a geometric representation of an IC design. A layout database may be represented in a standard format such as the Cal-Tech Intermediate format (CIF), or the GDS2 standard format. A layout database typically includes geometric parameters associated with geometric objects, or geometries (e.g., polygons), specifying the position and dimension of different layers of materials to be laid on a silicon wafer. The geometries are typically converted into respective rectangles arranged according to their physical location and commonly represented by parameter values in the form of coordinates.

The layout an IC design may be described in terms of a symbolic layout, or logical layout, rather than in terms of the actual geometry of the masks and layers that comprise the chip. A symbolic layout provides a higher level of abstraction than a mask layout, and is therefore easier to manipulate. In a symbolic layout, primitive components of an IC design may be organized in groups referred to as "cells", and the layout may be described in terms of the cells and their relative placement and interconnection. A cell that contains only primitive symbols (i.e. transistors, wires, capacitors and other physical components) is referred to as a "leaf cell".

There are a variety of symbolic layout methodologies commonly used by layout designers for logically representing an IC layout. Modern layout editors typically allow designers to select from multiple symbolic layout methodologies in order to accommodate different performance objectives. For example, in a hierarchical representation, a symbolic layout is treated as a hierarchical structure with multiple levels. Each level is a symbolic layout of various cells and primitive components. Another commonly used symbolic layout methodology involves creating a boundary layer which is a logical layer of a layout database wherein each cell is defined by a cell boundary which may be defined by the IC designer using a layout editor. Also, a designer may attribute cell names to each type of cell used in the design.

Layout editors also provide tools for minimizing the overall area of a layout (i.e., the size of the chip). Typical layout tools allow a designer to create individual layout cells including polygons, each layout cell representing a corresponding circuit structure (e.g., a NAND gate, a multiplier, a memory unit). The layout cells may be stored in files called cell libraries for use by the designer.

VLSI CAD systems also support verification, synthesis, and testing of IC designs. Post-Layout IC verification processes include layout parasitic extraction (LPE), design rule checking (DRC), and connectivity analysis. Design rules insure that an IC layout design is functional and capable of manufacture (e.g., design rules may prohibit a circuit layout from being designed with short circuits). IC analysis is also performed to verify that the electrical interconnections of a semiconductor chip correspond to an originally intended design once it has been determined that the design rules have been followed correctly (i.e., connectivity analysis). IC analysis for DRC and/or connectivity analysis is performed by examining the layout geometry of an IC. During examination of the layout, an actual net list may be generated which represents the interconnections of all elements on the chip.

Figure 1:
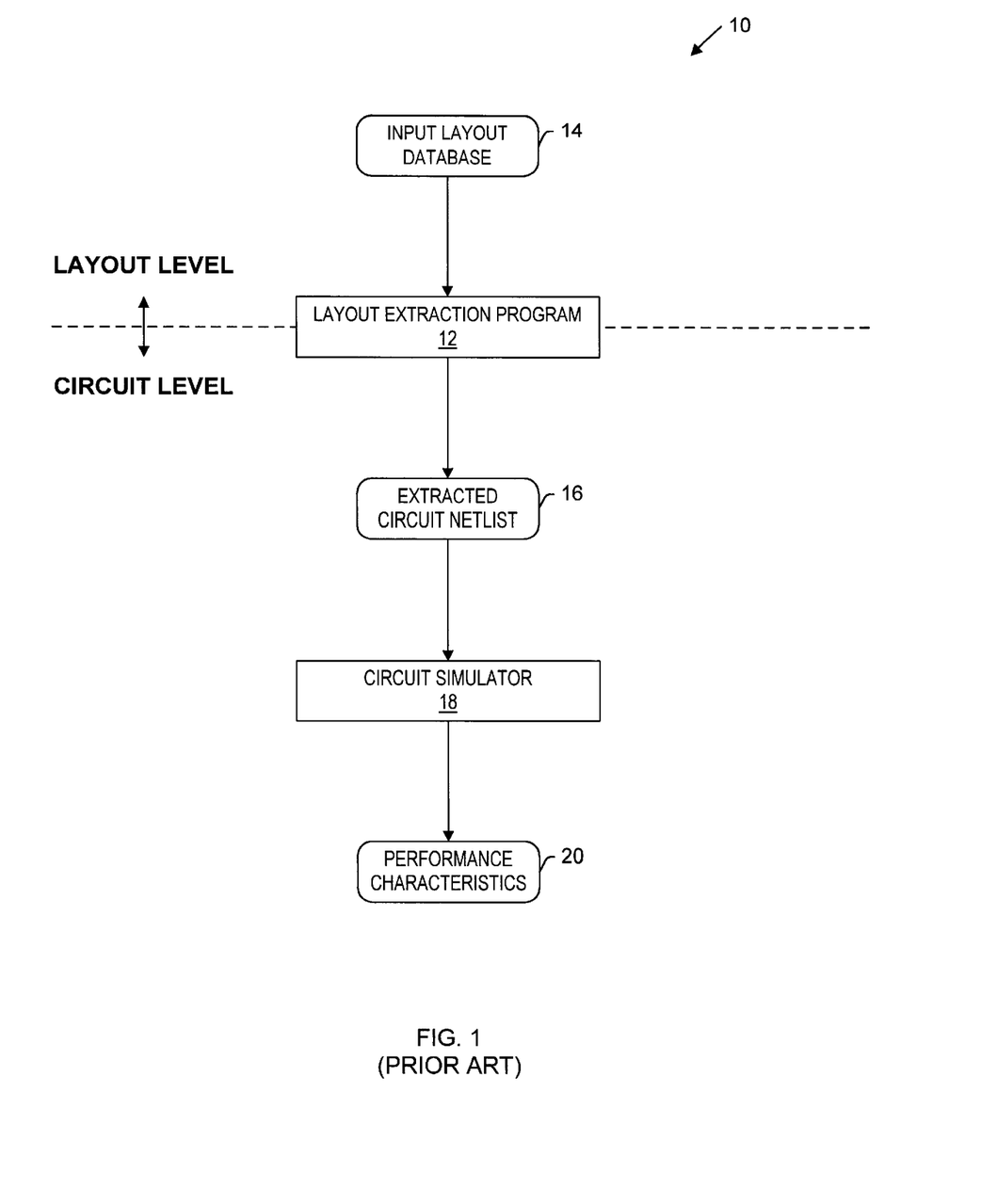
FIG. 1 is a block diagram illustrating a prior art system for IC layout parasitic extraction and circuit simulation in post-layout verification.

FIG. 1 shows a block diagram at 10 illustrating a prior art system for layout parasitic extraction and circuit stimulation in post layout verification. The system 10 includes: a layout extraction program 12 for receiving an input layout database 14 generated by a layout editor (not shown), and for generating a circuit net list 16; and a circuit simulator 18 for receiving the net list 16, and for generating performance characteristics 20 of the IC design. The layout extraction program 12 traces the layout of an IC design represented by the input layout database 14, and constructs the net list 16 which is a net list of an actual layout. The actual net list extracted from a layout database may be compared with a desired net list representative of the desired electrical connectivity. This comparison may be done by a layout versus schematic (LVS) program (not shown). If the actual net list does not agree with the desired net list, it is likely that an error exists in the computer software for constructing the layout.

Layout extraction refers to a process of converting a layout data base into an electric circuit representation including transistors, resistors, capacitors. etc. The extracted electric circuit may then be used for simulation. For large scale IC designs, the layout extraction process is computationally intensive, and therefore time consuming. Compaction methods, which include compressing geometric data of a layout database, are examples of prior art methods for reducing the time required for layout extraction. However, even with the use of compaction methods, the layout extraction process remains computationally intensive, and time consuming.

As circuit designs continue to increase in size, the traditional process for layout extraction and circuit simulation in post-layout verification become impractical due to the time required in extracting these circuit designs from layout database. A layout database for a ULSI or VLSI circuit design may include millions of geometric objects.

What is needed is a more efficient layout parasitic extraction process which is less computationally intensive and therefore less time consuming.

What is also needed is more efficient circuit simulation process in post layout verification.

SUMMARY OF THE INVENTION

Briefly, a presently preferred embodiment of the present invention provides a process of generating a synoptic layout database for efficient layout parasitic extraction and circuit simulation in post-layout verification of an integrated circuit (IC) design for a system having a plurality of repetitive sub-circuits. The process includes the steps of: receiving an input layout database including a plurality of geometric objects including cells representing the IC design, each of the cells including a plurality of polygons; identifying a plurality of repetitive cells of the input layout database, the repetitive cells being associated with the repetitive sub-circuits; recognizing at least one pattern of the repetitive cells; defining at least one cut region of the input layout database, the cut region being defined by physical layout coordinates, the cut region intersecting a corresponding pattern of the repetitive cells; and generating a synoptic layout database.

The cut regions may be defined by a user. The generating step includes the sub-steps of: accessing at least a portion of the geometric objects of the input layout database, and determining relationships between each of the geometric objects and the cut region.

The layout synopsizing process may be applied to an IC layout design representing any electronic system having a plurality of repetitive sub-circuits, such as a memory system having repetitive memory cells arranged in arrays (e.g., a random access memory, read only memory, or a cache of a central processing unit.)

In a first embodiment, the input layout database includes a boundary layer, the boundary layer including a plurality of cell boundaries, each of the cell boundaries defining a corresponding cell. In this embodiment, the step of identifying a plurality of repetitive cells further includes the steps of: determining a size parameter associated with each of the cells; determining sets of the cells, each of the cells of each one of the sets having a substantially equal size parameter associated therewith, and determining a largest one of the sets, the largest set including a greatest number of cells included therein.

In a second embodiment, the input layout database includes a cell hierarchy, the hierarchy including a plurality of cells. In this embodiment, the step of identifying a plurality of repetitive cells further includes the steps of: determining a size parameter associated with each of the cells; determining sets of the cells, each of the cells of each one of the sets having a substantially equal size parameter associated therewith, and determining a largest one of the sets, the largest set including a greatest number of cells included therein.

The step of determining relationships between each of the geometric objects and the cut region further comprises determining whether each of the geometric objects is disposed within one of the cut regions. Upon determining that a particular one of the geometric objects straddles a cut region, the process provides the user with the options of: excluding the object from the synoptic layout database, including the object in the synoptic layout database, or excluding the portion of the object which intersects the cut region from the synoptic layout database. The step of recognizing at least one pattern of the repetitive cells includes determining whether each of the repetitive cells is connected to another one of the repetitive cells.

An important advantage of the present invention is that a synoptic layout database generated in accordance with the process of the present invention allows for a more efficient layout parasitic extraction which is less computationally intensive and therefore less time consuming.

Another important advantage of the present invention is that a synoptic layout database generated in accordance with the process of the present invention allows for a more efficient circuit simulation process in post layout verification.

The foregoing and other objects, features, and advantages of the present invention will be apparent from the following detailed description of the preferred embodiment which makes reference to the several figures of the drawing.

DETAILED DESCRIPTION OF THE PREFERRED EMBODIMENTS

The present invention provides a layout synopsizing process for reducing the amount of geometric data of a layout database for purposes of performing a more efficient layout parasitic extraction and circuit simulation in post layout verification. As further explained below, the layout synopsizing process may be applied to an IC layout design representing any electronic system having a plurality of repetitive sub-circuits, such as a memory system having repetitive memory cells arranged in arrays (e.g., a random access memory, read only memory, or a cache of a central processing unit.) Other examples of electronic systems having a plurality of repetitive sub-circuits include image sensing devices having repetitive image sensing cells arranged in regular arrays. The layout synopsizing process may also be applied to an electronic system having repetitive data paths.

Figure 2:
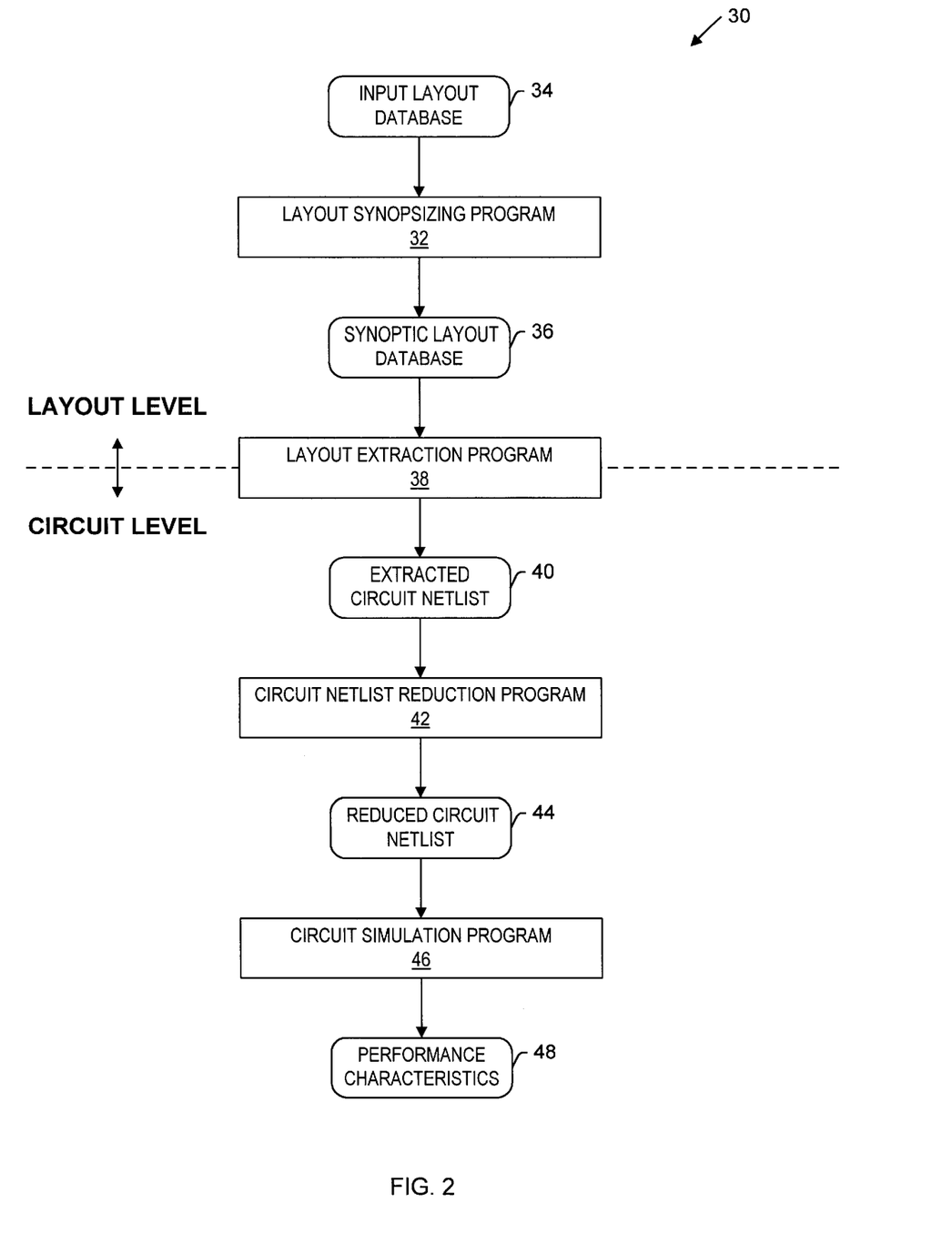
FIG. 2 is a block diagram illustrating an efficient layout parasitic extraction and post layout verification system in accordance with the present invention for verifying a circuit having repetitive sub-circuits, the verification system including a layout synopsizing program.

FIG. 2 shows a block at 30 illustrating a layout parasitic extraction and post layout verification system in accordance with the present invention. The system 30 includes: a layout synopsizing program 32 in accordance with the present invention for receiving an input layout database 34, and for generating a synoptic layout database 36 as further explained below; a layout parasitic extraction program 38 for receiving the synoptic layout database 36, and for generating an extracted circuit net list 40; a circuit net list reduction system 42 for receiving the net list 40, and for generating a reduced circuit net list 44; and a circuit simulation program 46 for receiving the net list 44 and for generating simulated performance characteristics 48 describing the IC represented by the input layout database.

The input layout database 34 may be generated by an IC designer using a layout editor (not shown) in accordance with any of a plurality of symbolic layout methodologies in order to accommodate different performance objectives. For example, if the IC designer uses a hierarchical representation, a symbolic layout is treated as a hierarchical structure with multiple levels wherein each level is a symbolic layout of various cells and primitive components. The IC designer may also choose to employ a boundary layer methodology, or may attribute cell names to each cell of the input layout database.

The extraction program 38 may be implemented by any of a variety of commercially available layout parameter extraction programs (e.g., Dracula Flat and Hierarchical layout parameter extraction (LPE) available from Cadence Design Systems, Inc. of San Jose, Calif.). Layout extraction processes, which include computing and extracting key electrical parameters from a layout database, are computationally intensive. Therefore, it is desirable to reduce the amount of time and computing power required for extraction of the layout database.

The layout synopsizing program 32 performs a layout synopsizing process on the input layout database representing an original IC design, and generates the synoptic layout database 36 which includes geometric data representing less than all sub-circuits of the original IC design. As further explained below, less computing power is required by the extraction program 38 to extract layout parameters from the synoptic layout database 36 than is required to extract layout parameters from the input layout database 34.

The circuit netlist reduction program 42 is described in U.S. patent application Ser. No. 08/766,358, filed Dec. 13, 1996, entitled "Method for Simulating ULSI/VLSI Circuit Designs" which is incorporated herein by reference.

Figure 3A:
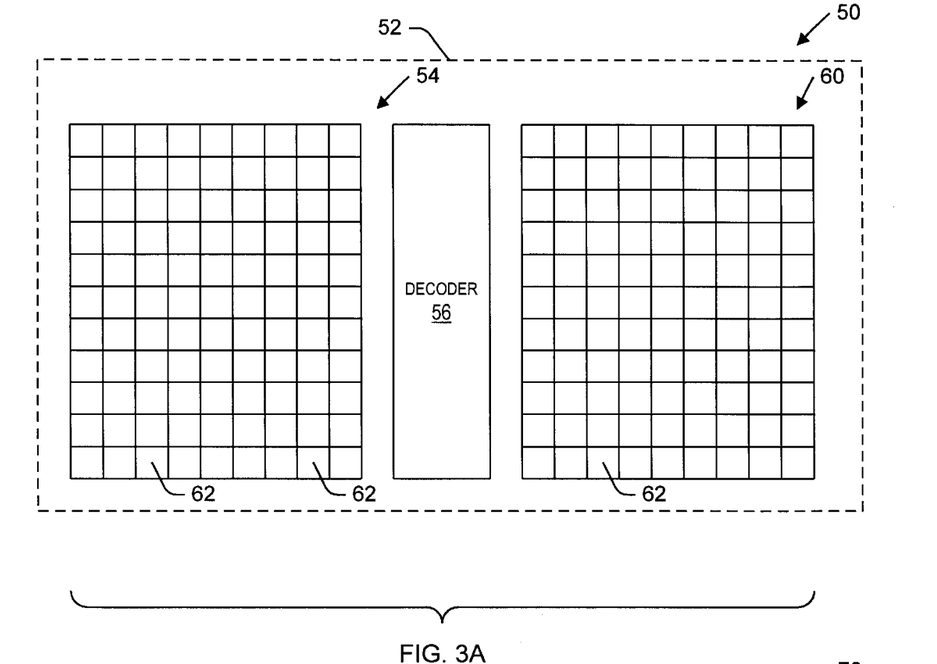
FIG. 3A is a block diagram illustrating a layout view of an exemplary memory system for which a layout database may be generated, synopsized, efficiently extracted, and verified in accordance with the present invention.

FIG. 3A shows a block diagram at 50 illustrating a layout view of one example of an electronic system having repetitive sub-circuits for which the layout synopsizing process of the present invention may be applied. The exemplary system is a memory system 52 including a first memory array 54, a decoder 56, and a second memory array 60. Each of the memory arrays 54, 60 includes a plurality of layout memory cells 62, each of the layout memory cells representing circuitry (not shown) for storing one bit of data. A layout database geometrically representing the memory system 52 may be generated, synopsized, and verified in accordance with the present invention.

In the layout level, each of the layout memory cells 62 includes geometric objects, such as polygons, representing primitive circuit components (not shown) of the corresponding memory cell. An input layout database 34 (FIG. 2) including geometric data representing the memory system 52 may be generated by a designer using a layout editor (not shown).

For ease of explanation, it is assumed that each of the layout memory cells 62 represents a memory sub-circuit (or memory cell as it is referenced to on the system level) having a substantially identical circuit structure, and therefore, each of the layout cells 62 is substantially identical.

As further explained below, the layout synopsizing program 32 (FIG. 2) provides for excluding, or omitting, selected layout cells representing selected repetitive circuit structures of the original IC design from the input layout database 34 (FIG. 2) in order to generate the synoptic layout database 36 (FIG. 2). Layout cells associated with selected repetitive circuit structures are omitted from the synoptic layout file for the purpose of minimizing the time and computing power required for the extraction process and post layout verification processes without sacrificing accuracy.

The included geometric objects and corresponding geometric parameters of the synoptic layout database provide adequate representative geometric data so that an accurate representation of the performance characteristics of the original IC design may be determined.

Figure 3B:
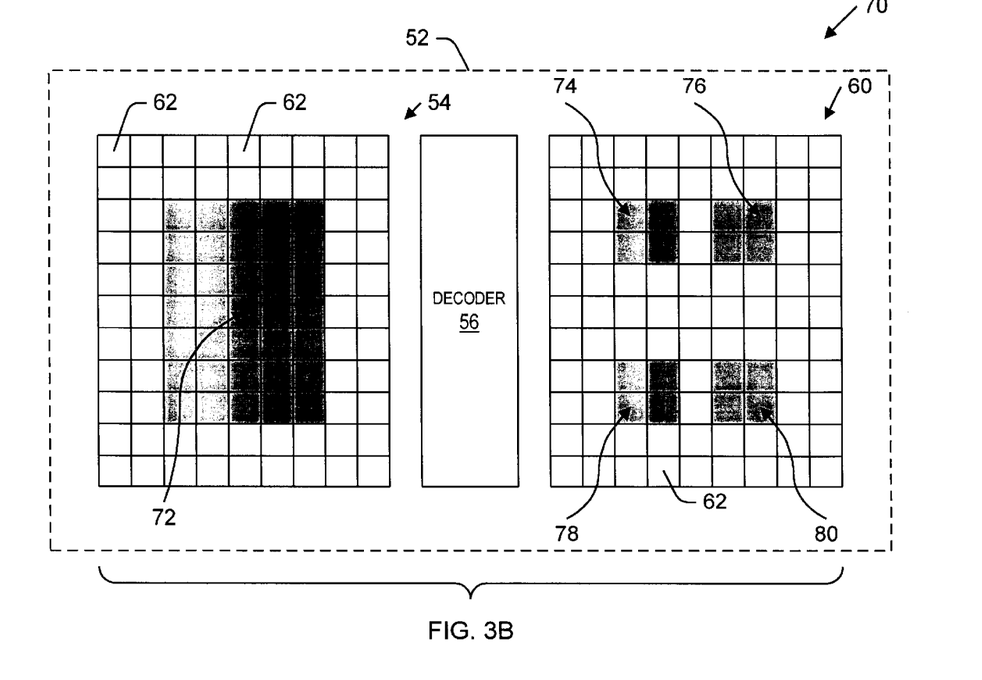
FIG. 3B is block diagram illustrating a layout view of exemplary cut regions including selected repetitive cells of the memory system of FIG. 3A, the repetitive cells being identified and selectively excluded from the layout database in accordance with a layout synopsizing process of the present invention.

FIG. 3B is a block diagram illustrating a layout view at 70 of cut regions including layout cells selected for omission from the synoptic layout database.

For purposes of IC verification, it is not necessary to determine performance characteristics for all of the repetitive sub-circuits of the original IC design. Accurate post layout verification and simulation may be accomplished by determining performance characteristics of representative ones of the repetitive sub-circuits of the original IC design. In accordance with the present invention, repetitive sub-circuits having extreme case performance characteristics associated therewith are selected for inclusion in the synoptic layout database in order to establish a range of performance characteristics, and other repetitive sub-circuits of the original IC design having intermediate performance characteristics associated therewith, are designated as being extraneous and layout cells representing these subcircuits are excluded from the synoptic layout database.

For example, for determining propagation delay characteristics and parasitic capacitive characteristics, the user may select groups of cells which are representative of a range of performance characteristics for inclusion in the synoptic layout database. In order to achieve a meaningful post layout verification and simulation providing an accurate range of performance characteristics, the user may select: (1) cells which are connected via signal paths causing a greatest propagation delay, and (2) cells which are connected via signal paths causing a smallest propagation delay.

In the depicted example, the synoptic layout database 36 is generated to include geometric data representing: all cells 62 of the first memory array 54 excluding cells of a first selected cut region 72; and all cells 62 of the second memory array 60 excluding cells of four selected cut regions 74, 76, 78, and 80. As further explained below, geometric data associated with each of the cells of cut regions 72, 74, 76, 78, and 80 are omitted from the synoptic layout database 36. The various cut regions, and cells included therein, are selected for omission from the synoptic layout file based on their physical location and the interconnection of the included cells with decoder 56 and other circuitry (not shown) via corresponding data paths. The goal in selecting repetitive cells for inclusion and exclusion from the synoptic layout data base 36 is to establish a database including only those cells associated with sub-circuits having extreme case performance characteristics associated therewith. Therefore, the cut regions are selected for omission from the synoptic layout file based on a determination that the cells of the cut region are extraneous because the sub-circuits associated with the cells of the cut region have intermediate value performance characteristics associated therewith, the intermediate value performance characteristics being unnecessary for the purpose of establishing the desired range of performance characteristics. Omitting cells of the cut regions from the synoptic layout minimizes the amount of geometric data of the synoptic layout database while still allowing for an adequate representation of performance characteristics of all the repetitive cells.

In the depicted example the memory cells 62 of the first selected cut region 72 are located in a central portion of the first array 54, and therefore, these cells and decoder 56 have associated characteristics (propagation delays and parasitic capacitances) which are less than the characteristics associated with a first plurality of the cells 62 of array 54 which are disposed outside of cut region 72, and greater than the characteristics associated with a second plurality of the cells 62 of array 54 which are disposed of outside of cut region 72. Therefore, the cells 62 of the first selected cut region 72 may be considered to be extraneous for purposes of determining a range of propagation delay values and parasitic capacitance values associated with all cells of the array 54.

The depicted cut regions 74, 76, 78, and 80 of array 60 provide another example of how cut regions may be selected by the user of the synopsizing program.

Figure 4:
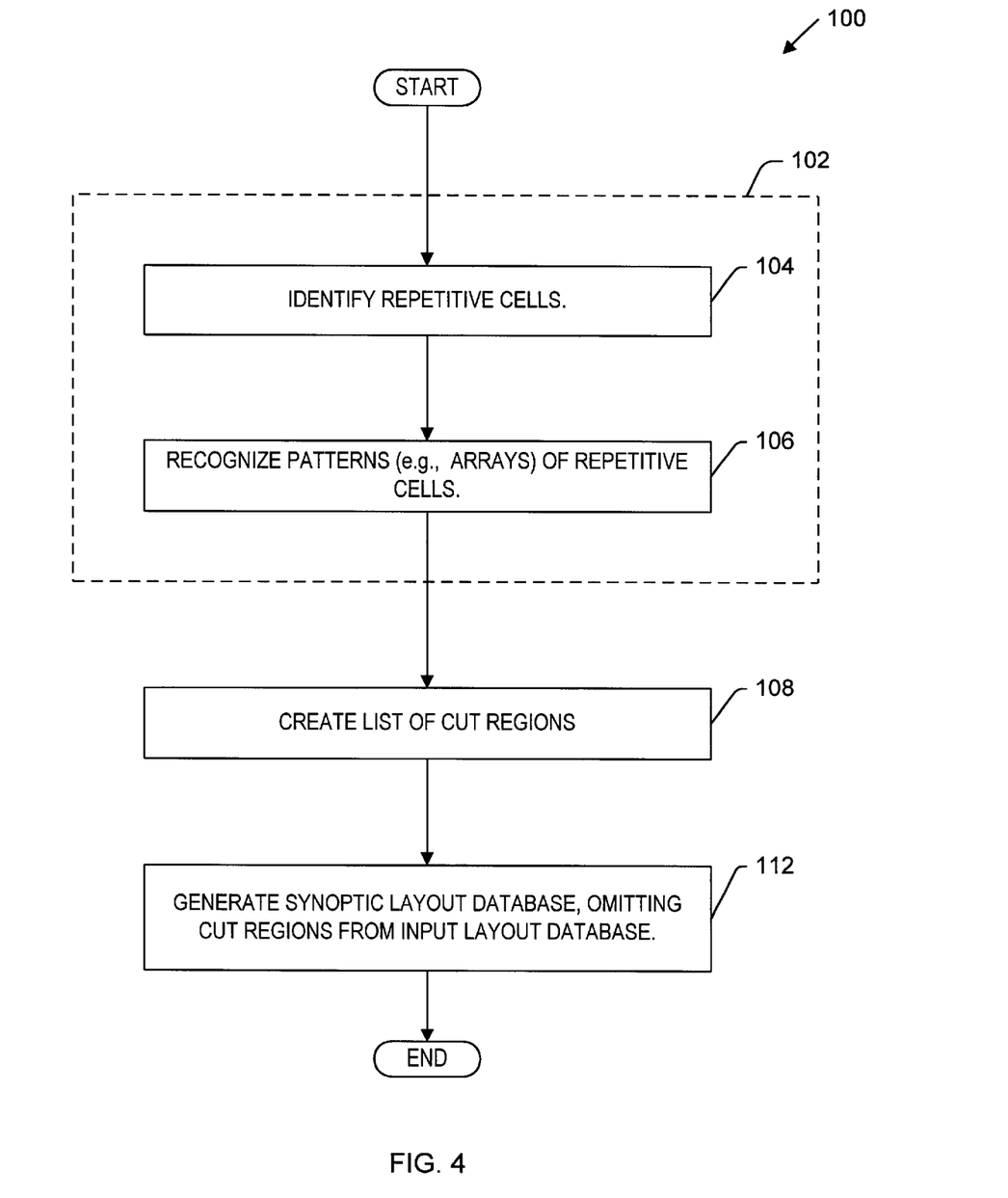
FIG. 4 is a flow diagram illustrating the layout synopsizing process of the present invention, the process including a repetitive cell identifying step, a cell pattern recognition step, a cut region defining step, and a database generating step.

FIG. 4 shows a flow diagram at 100 illustrating a layout synopsizing process in accordance with the present invention, the process being implemented by the layout synopsizing program 32 (FIG. 2). The synopsizing process provides for reducing the amount of geometric data required for layout parameter extraction and circuit simulation in post layout IC verification by: (1) identifying a pattern of repetitive layout cells of the input layout database 34 (FIG. 2), the repetitive layout cells representing repetitive sub-circuits of the IC design; and (2) excluding selected ones of the repetitive layout cells of the input layout database as further explained below.

The process begins with execution of an intelligent pattern recognition sub-process 102 for identifying repetitive circuit structures of the original IC design by recognizing repetitive layout cells in the input layout database 34 (FIG. 2). The present invention provides four different intelligent cell pattern recognition sub-processes which are selectable by a user of the layout synopsizing program 32 (FIG. 2). These processes include: (1) a boundary layer recognition sub-process in which repetitive cells are identified using a boundary layer; (2) a cell hierarchy recognition sub-process in which repetitive cells are identified using a cell hierarchy; (3) a cell name recognition sub-process in which repetitive cells are identified using cell names specified in the layout database; and (4) a geometry pattern recognition sub-process. The cell name recognition sub-process is simplest because the repetitive cells are previously identified using cell names specified in the layout, and no further explanation is required. Each of the other pattern recognition processes is further explained below. The user may select from the pattern recognition sub-processes based on the layout methodology used by the layout designer for logically representing the geometric objects of the IC layout design. For example, if the input layout database 34 (FIG. 2) includes a boundary layer, the use may select the boundary layer recognition sub-process.

The intelligent pattern recognition sub-process 102 includes a first step 104 of identifying repetitive layout cells of the input layout database, such as the repetitive memory cells 62 (FIG. 3A) and memory arrays 54 and 60 (FIG. 3A) of the memory system 52 (FIG. 3A). In step 104, the synopsizing program identifies repetitive memory cells 62 (FIG. 3A) of the memory system by identifying repetitive layout cells of the input layout database 34 (FIG. 2) representing the memory system. From step 104, the process proceeds to execute a cell pattern recognition step 106 in which memory arrays 54 and 60 (FIG. 3A) of the memory system are recognized by determining if the cells identified in step 102 form a continuous array. As further explained below, this determination includes checking physical coordinates of the layout memory cells, and determining relationships between the physical coordinates of these cells.

From step 106, the process proceeds to execute a cut region defining step 108 in which a list of cut regions are created. As explained above, the cut regions include selected ones of the repetitive sub-circuits of the original IC design which are designated to be extraneous for a corresponding particular type of IC verification process. In one embodiment, extraneous layout cells associated with extraneous sub-circuits are chosen to be excluded from the synoptic layout database 36 (FIG. 2) by the user of the synopsizing program 32 (FIG. 2). As described above, for the exemplary memory system 52 (FIGS. 3A and 3B), the user may select the cut regions including extraneous layout cells by analyzing the physical location of each of the repetitive cells and the interconnections of each of the repetitive cells with data paths and other relevant circuitry. In step 112, as further explained below, the layout synopsizing program generates the synoptic layout database 36 (FIG. 2) by scanning the input layout database 34 (FIG. 2) and omitting the extraneous layout cells representing the selected repetitive sub-circuits of the cut regions.

Figure 5:
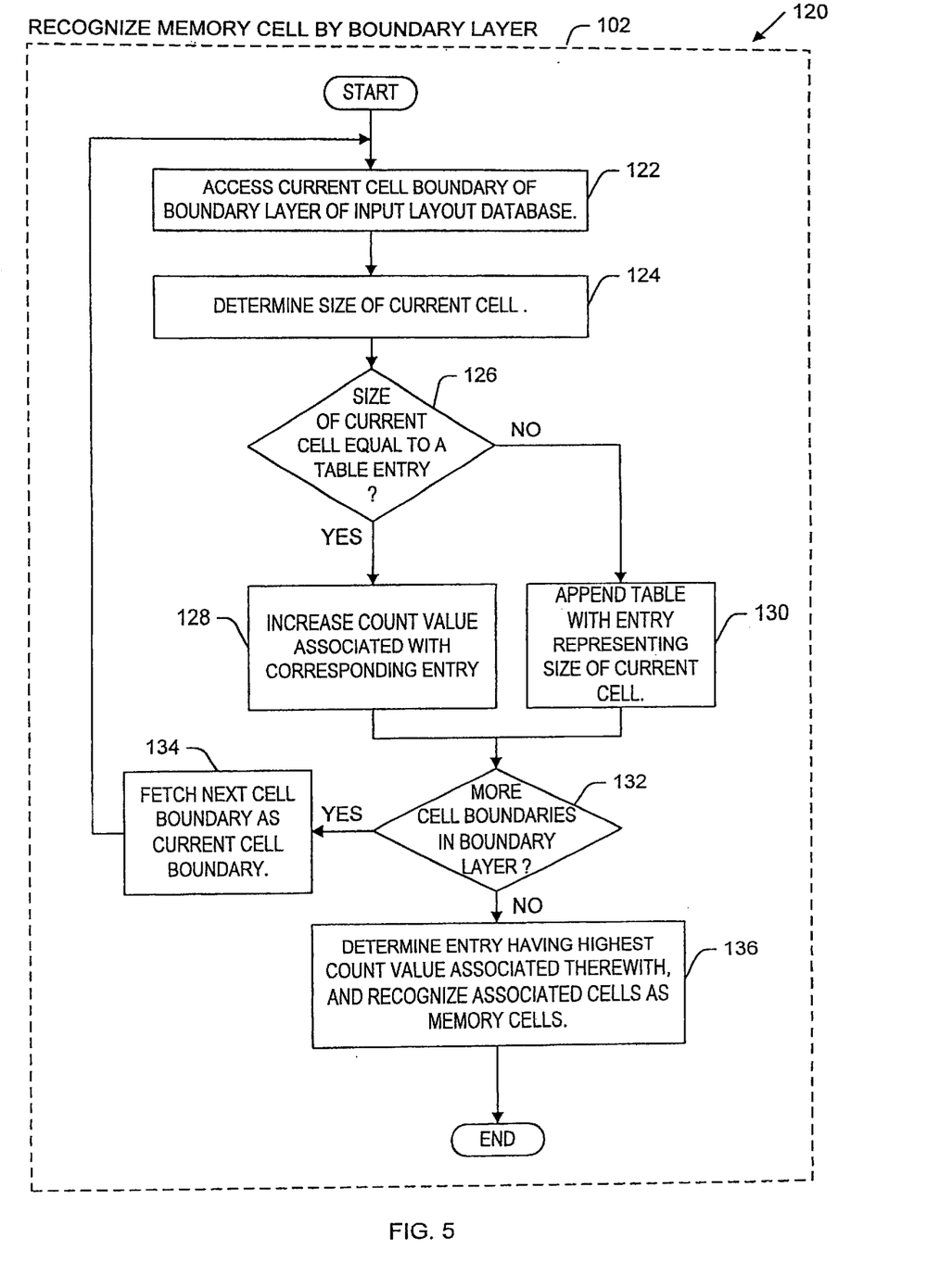
FIG. 5 is a flow diagram illustrating a first embodiment of the repetitive cell identifying step in which repetitive memory cells of the memory system are identified in accordance with a boundary layer recognition sub-process.

FIG. 5 shows a flow diagram at 120 illustrating a first embodiment of the repetitive cell identifying step 102 (FIG. 4) in which memory cells 62 (FIGS. 3A and 3B) of the memory system 52 are identified in accordance with a boundary layer recognition sub-process in which the repetitive cells are identified using a boundary layer. In a boundary layer, all cells are defined by a cell boundary which may be defined by the IC designer using a layout editor as mentioned above.

The depicted process identifies the memory cells 62 (FIGS. 3A and 3B) by: determining the size of each cell of the boundary layer; comparing the cell sizes to determine sets of cells wherein each cell of a particular set has a particular size; and determining which sets have the largest number of cells. Cells having a same size are assumed to be associated with identical circuit structures of the original IC design, and cells of the largest set of equal size cells are assumed to be the repetitive memory cells 62 (FIGS. 3A and 3B).

The depicted process begins with step 122 in which a current cell boundary of the boundary layer is accessed, the current cell boundary defining a current cell. In step 124, the size of the current cell is determined based on associated geometry data including coordinates associated with polygons included in the current cell boundary. It is then determined at 126 whether the size of the current cell is equal to a size associated with an entry of a size table (not shown). The size table is generated during execution of the depicted process and includes a plurality of entries, each representing a corresponding cell size. Each of the entries has a count value associated therewith for indicating the number of cells determined to have the corresponding cell size.

If it is determined at 126 that the size of the current cell is equal to a cell size represented by a particular entry of the table, the process proceeds to step 128 in which the program increases the count value associated with the particular entry, after which the process proceeds to 132. If it is determined at 126 that the size of the current cell is not equal to the cell size associated with any of the table entries, the process proceeds to step 130 in which the table is appended with a new entry representing the size of the current cell, after which the process proceeds to 132.

It is then determined at 132 whether there are more cell boundaries in the boundary layer, and if so, the process proceeds to step 134 in which the next cell boundary is fetched as the current cell boundary, after which the process proceeds back to repeat steps 122 to 132. Alternatively, if there is not more cell boundaries in the boundary layer, the process proceeds to step 136 in which an entry having the highest count value associated therewith is determined, and cells associated with this entry are recognized as the memory cells 62 (FIGS. 3A and 3B).

Figure 6:
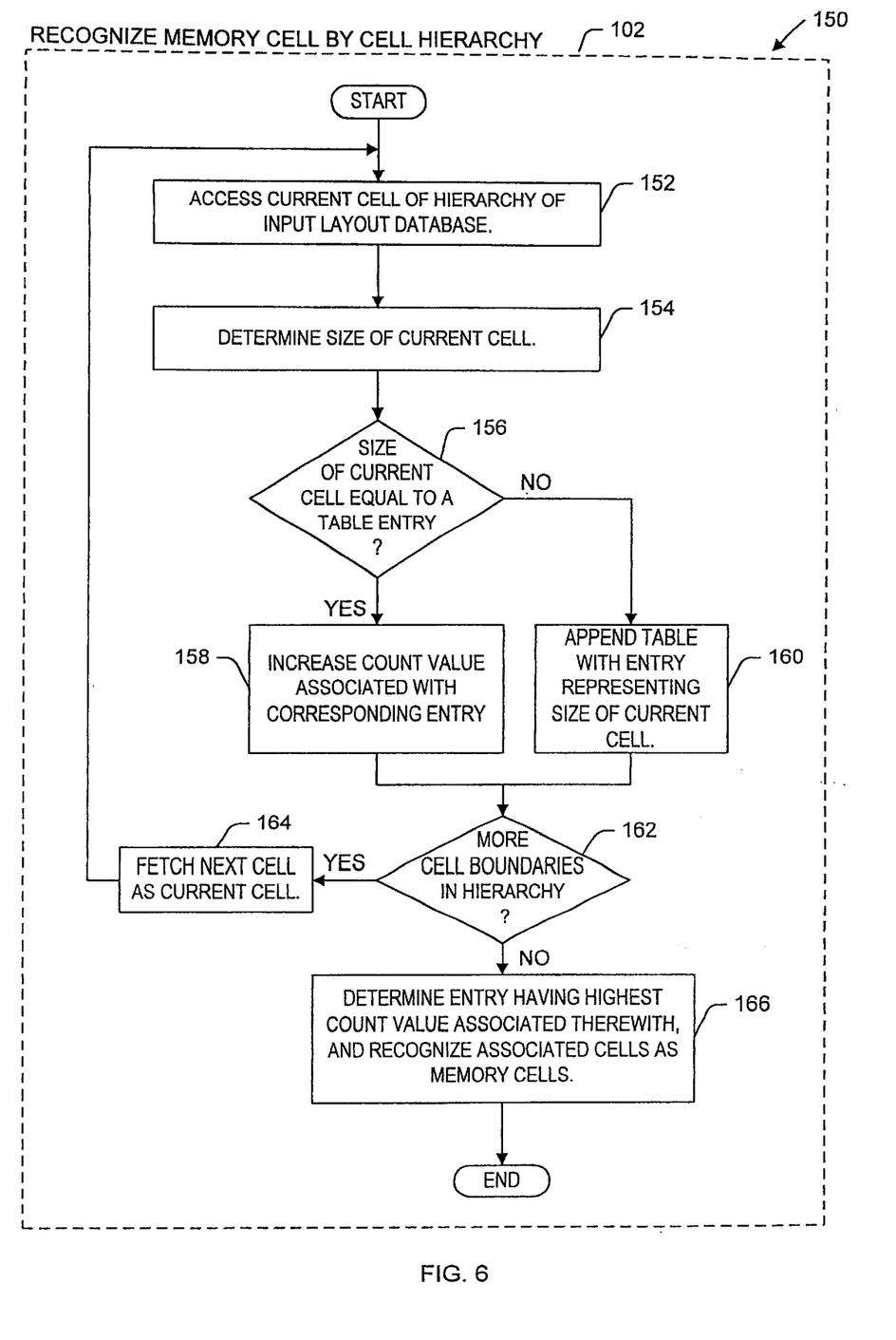
FIG. 6 is a flow diagram illustrating a second embodiment of the repetitive cell identifying step in which repetitive memory cells of the memory system are identified in accordance with a cell hierarchy recognition sub-process.

FIG. 6 shows a flow diagram at 150 illustrating a second embodiment of the repetitive cell identifying step 102 (FIG. 4) in which memory cells 62 (FIGS. 3A and 3B) of the memory system 52 are identified in accordance with a hierarchy recognition sub-process in which repetitive cells are identified by their hierarchies. For each cell, based on its content, a "virtual" boundary is generated and the boundary coordinates are stored in a "virtual" hierarchy layer. Then, the hierarchy recognition sub-process is very similar to the boundary layer recognition sub-process 120 (FIG. 5). Cells of the hierarchy layer are processed in the same manner as cells of the boundary layer. The depicted steps 152, 154, 156, 158, 160, 162, 164, and 166 are substantially similar to steps 122, 124, 126, 128, 130, 132, 134, and 136 (FIG. 5) respectively except that these steps are applied to cells of the hierarchy layer instead of cells of the boundary layer.

Figure 7A:
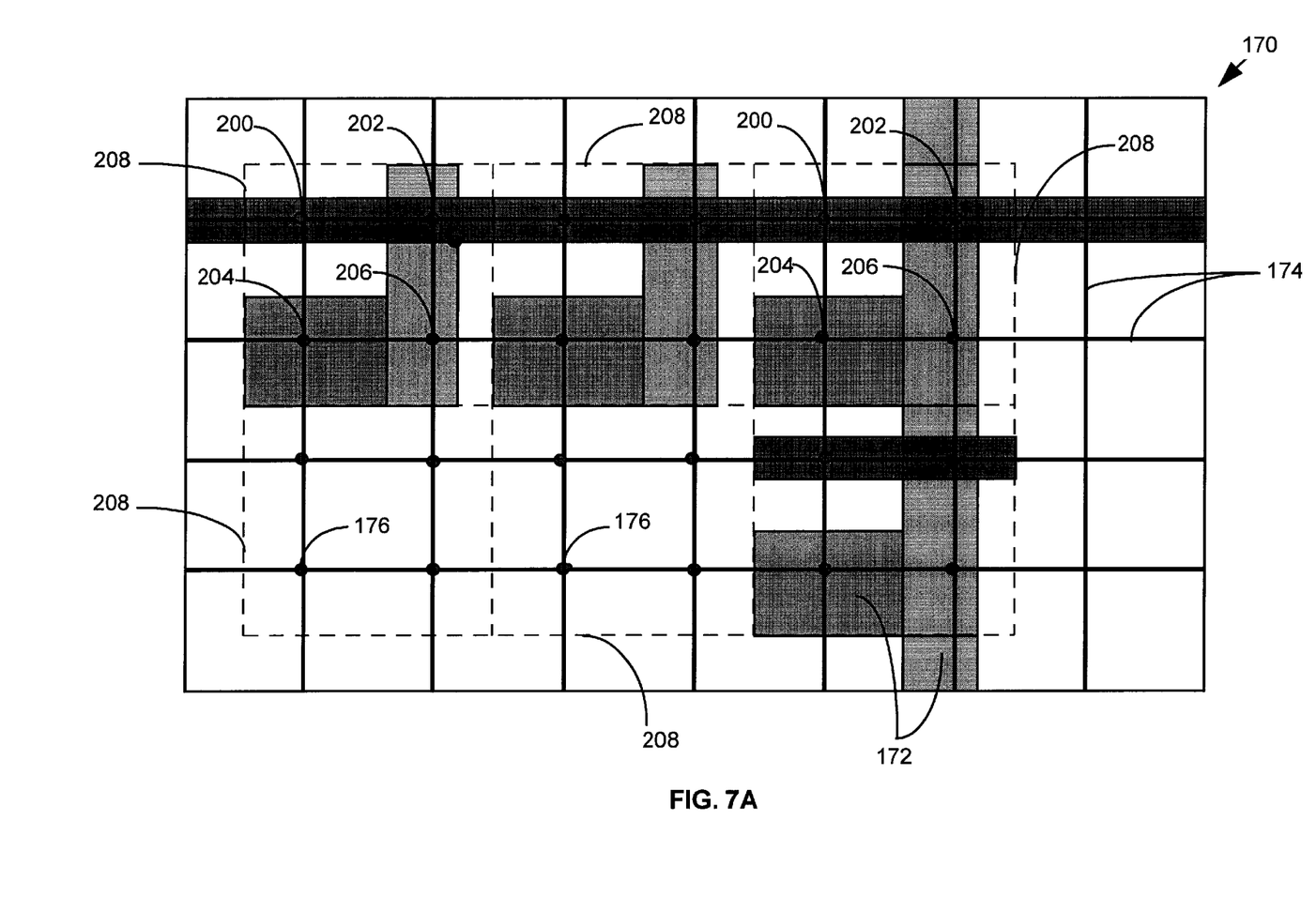
FIG. 7A is a block diagram illustrating a layout view of an exemplary memory system as modeled by a layout database having no cell hierarchy.

FIG. 7A shows a block diagram illustrating a layout view of a portion of a layout 170 of the memory system 52 (FIG. 3A) which is represented by an input layout database having no cell hierarchy. The layout database includes a large number of polygons 172, but no cell hierarchy. As further explained below, repetitive memory cells of the depicted memory system are identified in accordance with a third embodiment of the repetitive cell identifying step in which repetitive geometric structures, or polygons, are identified using a geometry pattern recognition sub-process applied to the layout database having no cell hierarchy. In accordance with the geometry pattern recognition sub-process, a virtual grid 174, including a plurality of grid points 176, is generated in the layout. As further explained below, memory cell boundaries are determined in the layout by generating and processing signature values for each of the grid points 176 as a function of properties of the particular layers intersect the grid point, and characteristics of polygons intersecting the grid point.

Figure 7B:
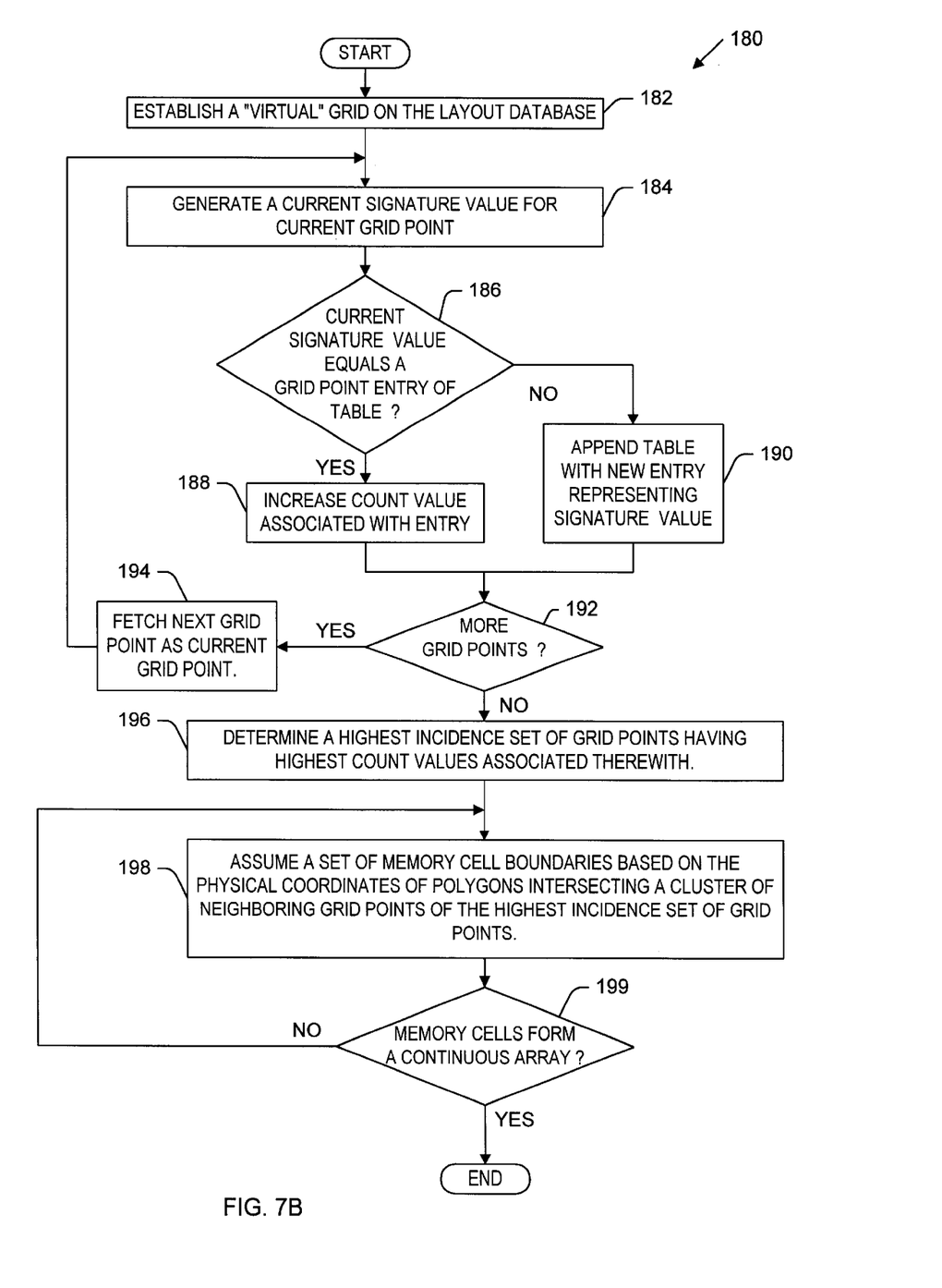
FIG. 7B is a flow diagram illustrating a third embodiment of the repetitive cell identifying step in which repetitive polygons are identified in accordance with a geometry pattern recognition sub-process applied to a layout database having no cell hierarchy.

FIG. 7B shows a flow diagram at 180 illustrating a third embodiment of the memory cell identifying step 102 (FIG. 4) in which memory cells 62 (FIGS. 3A and 3B) of the memory system 52 are identified in accordance with a geometry pattern recognition sub-process. The geometry pattern recognition sub-process is used if the input layout database 34 (FIG. 2) has no cell structure, that is the input layout database is a flat database. The depicted process begins with step 182 in which the virtual grid 174 (FIG. 7A) is established in the layout database. In one embodiment of the present invention, the grid is a virtual grid, or regular grid, wherein the pitch defining the grid points will be varied. A fine pitch provides a more accurate, but more computationally intensive, process as further explained below. In an alternative embodiment of the present invention, the grid established in step 182 may be generated using intersecting points of polygons of the input layout database as the grid points, thereby providing an irregular grid. In general, it is assumed that the grid spacing should be smaller than the anticipated size of memory cells of the layout.

From step 182, the process proceeds to step 184 in which a current signature value is generated from a current one of the grid points 176 (FIG. 7A) of the virtual grid established in step 182. The signature value generated for a particular grid point is a function of the number of layers at the grid point, characteristics of the particular layers intersecting the grid point, properties of the intersecting points including physical coordinates, the relative position of the grid points with respect to the geometric structures intersecting them, and the length or the width of the geometric structures.

From step 184, the process proceeds to 186 at which it is determined whether the current signature value equals a grid point entry of a grid point table. The grid table is generated during execution of the depicted process and includes a plurality of entries, each representing a corresponding signature value, and having a count value associated therewith for indicating the number of grid points determined to have a signature value equal to the signature value represented by the entry.

If it is determined at 186 that the current signature value equals a grid point entry of the table, the process proceeds to step 188 in which the count value associated with the entry is increased by an appropriate number. Alternatively, if it determined at 186 that the current signature value is not equal to the grid point entry of the table, the process proceeds to step 190 in which the table is appended with a new entry representing the signature value of the current grid point.

At 192, it is determined whether there are more grid points in the input layout database, and if so, the process proceeds to step 194 in which a next grid point is fetched as the current grid point, after which the process returns to execute steps 184–192 as described above.

After it is determined at 192 that there are no more grid points, the process proceeds from 192 to 194 at which a highest incidence set of grid points having highest count values associated therewith is determined.

From step 194, the process proceeds to step 196 in which a set of memory cell boundaries is assumed based on the physical coordinates of polygons intersecting a cluster of neighboring grid points of the highest incidence set of grid points. The cluster of neighboring grid points may be an adjacent pair of grid points. The neighboring grid points need not have the same signature value, not the same count value, but should have high relatively count values associated therewith.

With reference back to FIG. 7A, applying the geometry pattern recognition sub-process to the layout 170 of the memory system, a highest incidence set of grid points 200, 202, 204, and 206 is determined in steps 182–196 (FIG. 7B) as described above. For this example, in step 196 (FIG. 7A), memory cell boundaries 208 are assumed to be located at sets of coordinates defined by corresponding sets of polygons intersecting neighboring ones of the grid points 200, 202, 204, 206.

From step 196, the process proceeds to step 198 at which it is determined whether the set of memory cells (defined by the memory cell boundaries assumed in step 196) form a continuous array. For example, in the application of sub-process 180 to the layout 170 (FIG. 7A) of the memory system, it is determined whether the memory cells defined by memory cell boundaries 208 (FIG. 7A) form a continuous array. This determination includes checking physical coordinates of the memory cells, and determining relationships therebetween.

If it is determined at 198 that the memory cells do not form a continuous array, the process proceeds back to execute steps 196 and 198 as described above except that a different set of memory cell boundaries is assumed. If it is determined at 198 that a set of memory cells defined by memory cell boundaries assumed in step 196 form a continuous array, the process ends.

Figure 8:
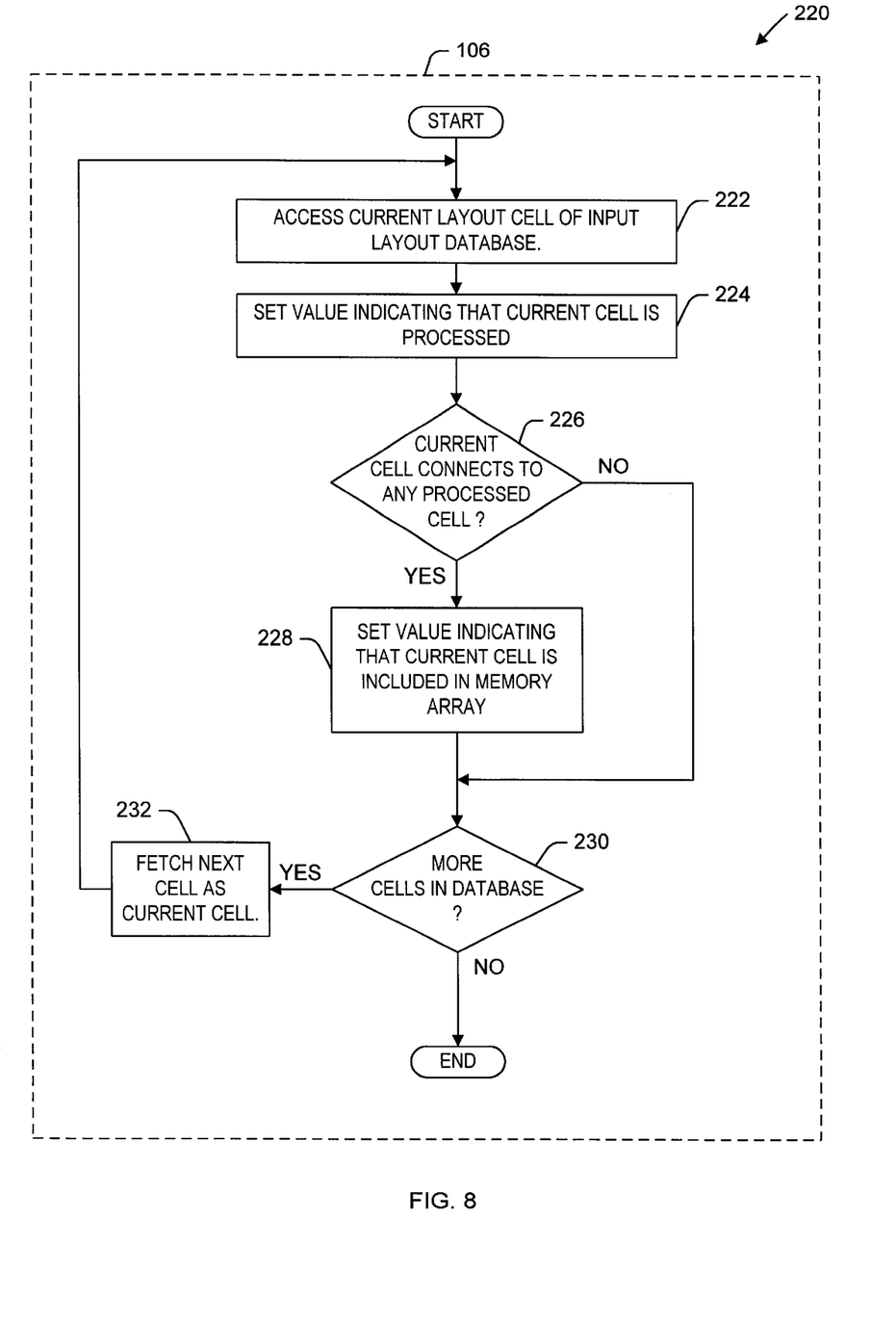
FIG. 8 is a flow diagram illustrating one embodiment of a subprocess for implementing the pattern recognition step in which arrays of repetitive memory cells are recognized by determining if the memory cells form a continuous array.

FIG. 8 shows a flow diagram at 220 illustrating one embodiment of a sub-process for implementing the cell pattern recognition step 106 (FIG. 4) of the synopsizing process 100 in which memory arrays 54, 60 (FIGS. 3A and 3B) of the IC design are recognized by determining if the memory cells identified in step 104 (FIG. 4) form a continuous array. As mentioned, this determination includes checking physical coordinates of the memory layout cells, and determining relationships between the physical coordinates of the layout cells.

The depicted sub-process begins with step 222 in which a current layout memory cell of the input layout database 34 (FIG. 2) is accessed, and proceeds to step 224 in which a process status value associated with the current layout memory cell is set to indicate that the cell has been processed. It is then determined at 226 whether the current layout memory cell is connected to any previously processed layout memory cell of the input layout database, and if so, the sub-process proceeds to step 228 in which an array status value is set to indicate that the current layout memory cell is included in a memory array, after which the process proceeds to 230. The assumption made in step 228 is that if any two of the memory cells are connected to each other, then each of these cells are included in a continuous array of memory cells. If it is determined at 226 that the current layout cell is not connected to a previously processed cell, then it is assumed that the current memory cell is not part of a continuous array, and the process proceeds from 226 directly to 230.

It is then determined at 230 whether there are more cells in the layout database to be processed, and if so, the process proceeds to step 232 to fetch a next cell as the current cell after which the process repeats steps 222–228 as described above. Alternatively, the sub-process implementing step 106 ends, and the process 100 returns to step 108 (FIG. 4).

Figure 9A:
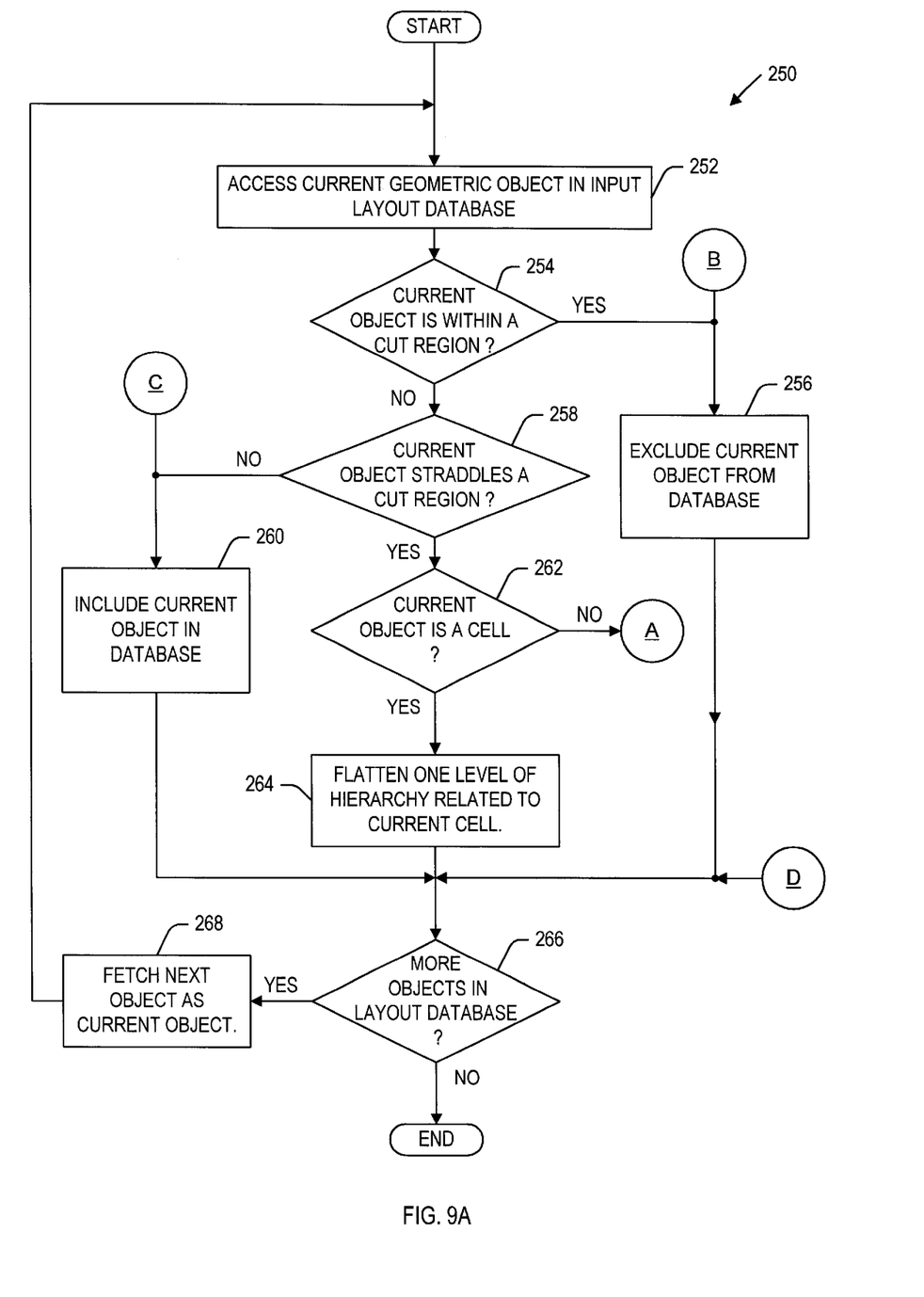
FIGS. 9A and 9B is a flow diagram illustrating one embodiment of a sub-process for implementing the data base generating step in which the synoptic layout database is generated based on the input layout database and the cut regions.

FIG. 9A shows a flow diagram at 250 illustrating a sub-process for implementing the data base generating step 112 (FIG. 4) of the synopsizing process 100 in which the synoptic layout database 36 (FIG. 2) is generated based on the input layout database 34 (FIG. 4) and the cut regions created in the cut region defining step 108 (FIG. 4). The depicted sub-process begins with step 252 in which a current geometric object of the input layout database 34 (FIG. 2) is accessed. From step 252, the sub-process proceeds to 254 at which it is determined whether the current geometric object is located within one of the cut regions 72-80 (FIG. 3B) which are defined in step 108 (FIG. 4), and if so, the sub-process proceeds to step 256 in which the current geometric object is excluded from the synoptic layout database 36 (FIG. 2).

If it is determined at 254 that the current geometric object is not located within one of the cut regions, the sub-process proceeds to 258 at which it is determined whether the current geometric object straddles one of the cut regions that is whether the current geometric object is disposed partially within and partially outside of the cut region, and if not, the sub-process proceeds to step 260 in which the current geometric object is included in the synoptic layout database 36 (FIG. 2).

Note that where two circuit structures are connected, there is one node. Omitting geometric data representing a connection between two structures results in two nodes, and therefore a floating node. The circuit net list reduction program 42 (FIG. 2) recognizes floating nodes as is well understood in the art. In one embodiment, an appropriate load is provided to each of the floating nodes. In another embodiment, each of the floating nodes may be ignored.

If it is determined at 258 that the current geometric object straddles one of the cut regions, the sub-process proceeds to 262 at which it is determined whether the current geometric object is a cell, and if so, the sub-process proceeds to step 264 in which one level of the hierarchy related to the current cell is flattened, the contents of the cell is flattened out, and all of the flattened geometric objects of the cell are later processed in accordance with the depicted steps. If it is determined at 262 that the current object which straddles a cut region is not a cell, the process proceeds to "A" (to FIG. 9B) as further explained below.

From each of steps 256, 260, and 264, the sub-process proceeds to 266 at which it is determined whether there are more geometric objects in the input layout database, and if so, the sub-process proceeds to step 268 in which a next object is fetched from the input layout database as a current object. Alternatively, the sub-process implementing step 106 ends, and the process 100 returns to step 108 (FIG. 4).

Figure 9B:
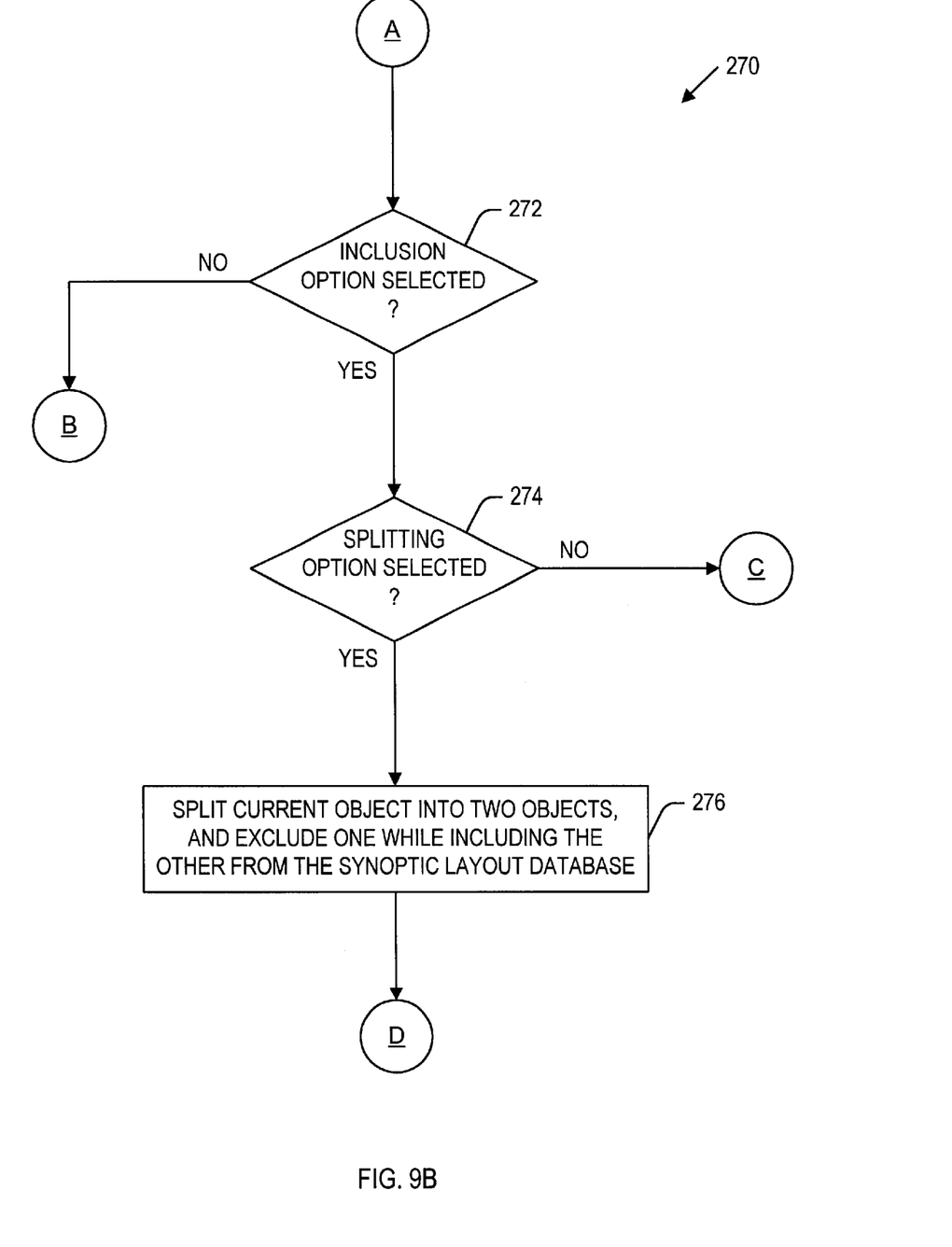

FIG. 9B shows a flow diagram at 270 illustrating further steps of the sub-process 250 (FIG. 9A) for implementing the data base generating step 112 (FIG. 4) of the synopsizing process 100, the depicted steps being performed if it is determined at 262 (FIG. 9A) that a current object determined to straddle a cut region is not a cell. In the synopsizing process of the present invention, the user is provided with: (1) an exclusion option in which geometric objects determined to straddle a cut region are excluded from the synoptic layout database 36 (FIG. 2); (2) an inclusion option in which geometric objects determined to straddle a cut region are included in the synoptic layout database; or (3) a splitting option in which geometric objects determined to straddle a cut region are split into two portions, wherein one portion is included while the other is excluded.

The depicted sub-process proceeds from "A" (from FIG. 9A) to 272 at which it is determined whether the user has selected the inclusion option. If it is determined at 272 that the user has not selected the inclusion option, the process proceeds to "B" (to FIG. 9A) to execute the step 256 of excluding the current object from the database. Alternatively, it is assumed that either the inclusion option or the splitting option has been selected, and the process proceeds to 274 at which it is determined whether the user has selected the splitting option.

If it is determined at 274 that the user has not selected the splitting option, the process proceeds to "C" (to FIG. 9A) to execute the step 260 of including the current object in the synoptic layout database 36 (FIG. 2).

Alternatively, it is assumed that the splitting option has been selected, the process proceeds to execute a step 276 in which the current object is split into two objects, one of which is excluded from the synoptic layout database 36 (FIG. 2), and the other of which is included in the synoptic layout database. From step 276, the process proceeds back to "D" (to FIG. 9A) to determine whether there are more objects in the input layout database as described above.

Although the present invention has been particularly shown and described above with reference to a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A process of generating a synoptic layout database for efficient layout parasitic extraction and circuit simulation in post-layout verification of an integrated circuit (IC) design for a system having a plurality of repetitive sub-circuits, the process comprising the steps of:

receiving an input layout database including a plurality of geometric objects including cells representing the IC design, each of said cells including a plurality of polygons;

identifying a plurality of repetitive cells of said input layout database, said repetitive cells being associated with the repetitive sub-circuits;

recognizing at least one pattern of said repetitive cells;

defining at least one cut region of said input layout database, said cut region being defined by physical layout coordinates, said cut region intersecting a corresponding pattern of said repetitive cells; and generating a synoptic layout database, said generating step including the sub-steps of,
accessing at least a portion of said geometric objects of said input layout database, and
determining relationships between each of said geometric objects and said cut region.

2. A process of generating a synoptic layout database as recited in claim 1 wherein:

said input layout database includes a boundary layer, said boundary layer including a plurality of cell boundaries, each of said cell boundaries defining a corresponding cell; and said step of identifying a plurality of repetitive cells further comprises the steps of,
determining a size parameter associated with each of said cells;
determining sets of said cells, each of the cells of each one of said sets having a substantially equal size parameter associated therewith, and
determining a largest one of said sets, said largest set including a greatest number of cells included therein.

3. A process of generating a synoptic layout database as recited in claim 1 wherein:

said input layout database includes a cell hierarchy, said hierarchy including a plurality of cells; and said step of identifying a plurality of repetitive cells further comprises the steps of,
determining a size parameter associated with each of said cells;
determining sets of said cells, each of the cells of each one of said sets having a substantially equal size parameter associated therewith, and
determining a largest one of said sets, said largest set including a greatest number of cells included therein.

4. A process of generating a synoptic layout database as recited in claim 1 wherein said step of determining relationships between each of said geometric objects and said cut region further comprises:

determining whether each of said geometric objects is disposed within one of said cut regions;

provided that a particular one of said geometric objects is disposed within one of said cut regions, excluding said particular geometric object from said synoptic layout database.

5. A process of generating a synoptic layout database as recited in claim 1 wherein said step of determining relationships between each of said geometric objects and said cut region further comprises:

determining whether each of said geometric objects is disposed within one of said cut regions;

provided that a particular one of said geometric objects is disposed partially within one of said cut regions, excluding said particular geometric object from said synoptic layout database.

6. A process of generating a synoptic layout database as recited in claim 1 wherein said step of determining relationships between each of said geometric objects and said cut region further comprises:

determining whether each of said geometric objects is disposed within one of said cut regions;

provided that a portion of particular one of said geometric objects is disposed within one of said cut regions, excluding said portion of said particular geometric object from said synoptic layout database.

7. A process of generating a synoptic layout database as recited in claim 1 wherein:

said input layout database includes cell names associated with each of said cells; and said step of identifying a plurality of repetitive cells includes reading each of said cell names.

8. A process of generating a synoptic layout database as recited in claim 1 wherein said cut regions are defined by a user.

9. A process of generating a synoptic layout database as recited in claim 1 wherein said step of recognizing at least one pattern of said repetitive cells includes determining whether each of said repetitive cells is connected to another one of said repetitive cells.

10. A process of generating a synoptic layout database as recited in claim 1 wherein the system is a memory system having a plurality of repetitive memory sub-circuits, each of the memory sub-circuits for storing one bit of data.

11. A process of generating a synoptic layout database for efficient layout parasitic extraction and circuit simulation in post-layout verification of an integrated circuit (IC) design for a system having a plurality of repetitive sub-circuits, the process comprising the steps of:

receiving an input layout database including a plurality of layout cells geometrically representing the IC design, each of said cells including a plurality of geometric objects;

identifying a plurality of repetitive cells of said input layout database, said repetitive cells being associated with the repetitive sub-circuits;

selecting a plurality of extraneous cells from said repetitive cells; and generating a synoptic layout database including all of said cells of said input layout database except said extraneous cells.

12. A process of generating a synoptic layout database as recited in claim 11 wherein:

said input layout database includes a boundary layer, said boundary layer including a plurality of cell boundaries, each of said cell boundaries defining a corresponding one of said layout cells; and said step of identifying repetitive cells of the input layout database further comprises the steps of,
accessing geometric objects located within each of said cell boundaries defining a cell,
determining a size parameter associated for each of said cells;
determining sets of said cells, each of the cells of each one of said sets being substantially the same size;
determining a largest one of said sets; and
assuming that said cells of said largest set are repetitive cells.

13. A process of generating a synoptic layout database as recited in claim 12 wherein said step of identifying repetitive cells of the input layout database farther comprises the step of recognizing continuous arrays of said repetitive cells by determining physical coordinates of the repetitive cells, and by determining relationships between said physical coordinates.

14. A process of generating a synoptic layout database as recited in claim 11 wherein said integrated circuit is a memory circuit including a plurality of memory cells.

15. A process of generating a synoptic layout database as recited in claim 11, wherein said step of selecting a plurality of extraneous cells from said repetitive cells further comprises the steps of:

providing a user interface allowing a user to define cut regions including said extraneous cells.

16. A process of verifying an integrated circuit (IC) design for a system having a plurality of repetitive sub-circuits, the process comprising the steps of:

receiving an input layout database including a plurality of layout cells geometrically representing the IC design, each of said cells including a plurality of geometric objects;

identifying a plurality of repetitive cells of said input layout database, said repetitive cells being associated with the repetitive sub-circuits;

selecting a plurality of extraneous cells from said repetitive cells; and generating a synoptic layout database including all of said cells of said input layout database except said extraneous cells;

extracting a circuit net-list from said synoptic layout database; and processing said circuit net-list to verify characteristics of said integrated circuit.

17. A process of generating a synoptic layout database for efficient layout parasitic extraction and circuit simulation in post-layout verification of an integrated circuit (IC) design for a system having a plurality of repetitive sub-circuits, the process comprising the steps of:

receiving an input layout database including a plurality of layout cells geometrically representing the IC design, each of said cells including a plurality of geometric objects;

identifying a plurality of repetitive cells of said input layout database, said repetitive cells being associated with the repetitive subcircuits; and generating a synoptic layout database including less than all of said repetitive cells.

* * * * *